United States Patent
Meng et al.

(10) Patent No.: US 11,264,743 B2
(45) Date of Patent: Mar. 1, 2022

(54) PLUG CONNECTOR

(71) Applicants: FOXCONN (KUNSHAN) COMPUTER CONNECTOR CO., LTD., Kunshan (CN); FOXCONN INTERCONNECT TECHNOLOGY LIMITED, Grand Cayman (KY)

(72) Inventors: Wei Meng, Kunshan (CN); Zheng-Rong Zhu, Kunshan (CN); Jun Chen, Kunshan (CN); Yang-Tsun Hsu, New Taipei (TW)

(73) Assignees: FOXCONN (KUNSHAN) COMPUTER CONNECTOR CO., LTD., Kunshan (CN); FOXCONN INTERCONNECT TECHNOLOGY LIMITED, Grand Cayman (KY)

( * ) Notice: Subject to any disclaimer, the term of this patent is extended or adjusted under 35 U.S.C. 154(b) by 0 days.

(21) Appl. No.: 16/905,891

(22) Filed: Jun. 18, 2020

(65) Prior Publication Data

US 2020/0403333 A1 Dec. 24, 2020

(30) Foreign Application Priority Data

Jun. 18, 2019 (CN) .......................... 201910527291.2

(51) Int. Cl.
| | |
|---|---|
| H01R 12/70 | (2011.01) |
| H01R 12/77 | (2011.01) |
| H01R 12/62 | (2011.01) |
| H01R 13/629 | (2006.01) |
| H01R 12/79 | (2011.01) |

(52) U.S. Cl.
CPC ......... H01R 12/7005 (2013.01); H01R 12/62 (2013.01); H01R 12/777 (2013.01); H01R 12/79 (2013.01); H01R 13/629 (2013.01)

(58) Field of Classification Search
CPC .............. H01R 13/6658; H01R 13/629; H01R 23/7073; H01R 12/7005; H01R 12/777; H01R 12/62; H01R 12/79
USPC ........................................ 439/76.1, 660, 630
See application file for complete search history.

(56) References Cited

U.S. PATENT DOCUMENTS

| | | | |
|---|---|---|---|
| 8,834,185 B2 * | 9/2014 | Wu ...................... | H01R 9/2408 439/76.1 |
| 10,205,256 B2 | 2/2019 | Wu et al. | |
| 10,270,191 B1 | 4/2019 | Li et al. | |

* cited by examiner

*Primary Examiner* — Gary F Paumen
(74) *Attorney, Agent, or Firm* — Ming Chieh Chang; Wei Te Chung

(57) ABSTRACT

A plug connector includes: an insulative housing including a main body, a reinforcement projecting forward from the main body, and a pair of baffle plates; and a printed circuit board partially received in the insulative housing, the printed circuit board extending forward from the main body and beyond the reinforcement, the reinforcement wrapping on the printed circuit board, wherein a width of a front end of the printed circuit board exposed outside the main body in a horizontal direction is greater than a width of the reinforcement, and a limiting groove is formed between the baffle plate and the printed circuit board for guiding the plug connector to mate with a socket connector.

14 Claims, 6 Drawing Sheets

PLUG CONNECTOR

BACKGROUND OF THE DISCLOSURE

1. Field of the Disclosure

The present disclosure relates to a plug connector, in particular to a plug connector for easy insertion and removal.

2. Description of Related Arts

U.S. patent Ser. No. 10/205,256 discloses a cable connector which includes an insulative housing, a printed circuit board received in the insulative housing, a cable connected with the printed circuit board and a locking spring member. metallic shell disposed outside the insulative housing. The insulative housing includes a main body, a mating portion extending forward from the main body and a pair of baffles on both sides of the insulative housing. Between each baffle plate and the mating portion, there is a limiting groove for guiding the mating of the plug connector and the socket connector.

Since the printed circuit board is received in the insulative housing, the space of the limiting groove between the baffle plate and the mating portion is small, and it needs to be accurately mated when the plug connector is matched with the socket connector.

Therefore, an improved plug connector is desired.

SUMMARY OF THE DISCLOSURE

Accordingly, an object of the present disclosure is to provide a plug connector for easy insertion and removal.

To achieve the above object, a plug connector comprises: an insulative housing including a main body, a reinforcement projecting forward from the main body, and a pair of baffle plates; and a printed circuit board partially received in the insulative housing, the printed circuit board extending forward from the main body and beyond the reinforcement, the reinforcement wrapping on the printed circuit board, wherein a width of a front end of the printed circuit board exposed outside the main body in a horizontal direction is greater than a width of the reinforcement, and a limiting groove is formed between the baffle plate and the printed circuit board for guiding the plug connector to mate with a socket connector.

Other objects, advantages and novel features of the disclosure will become more apparent from the following detailed description when taken in conjunction with the accompanying drawings.

DETAILED DESCRIPTION OF THE PREFERRED EMBODIMENT

Reference will now be made in detail to the embodiments of the present disclosure.

Figure 1:
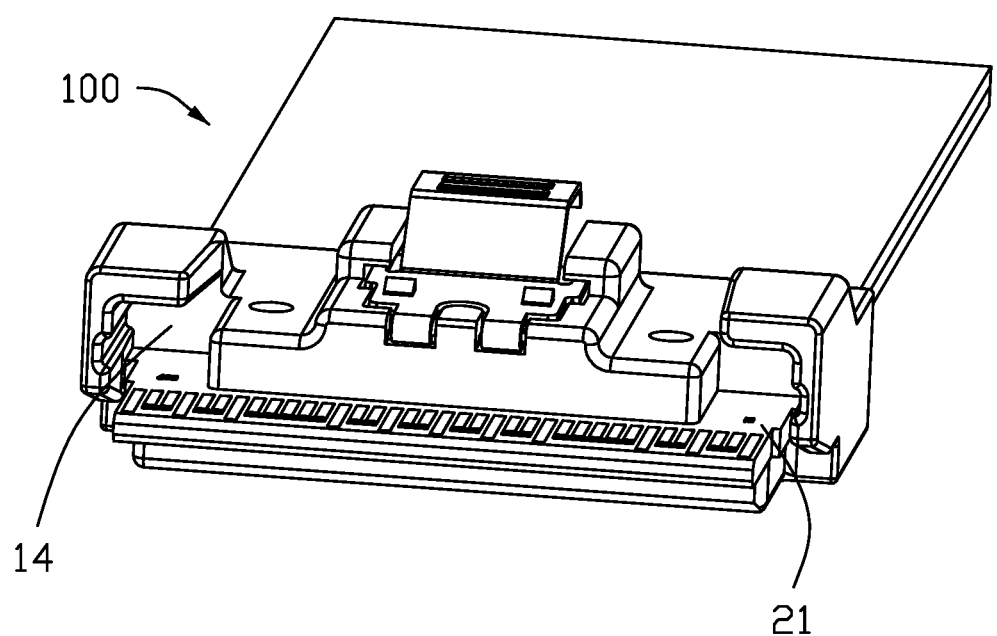
FIG. 1 is a perspective view of a plug connector according to the present invention.
Figure 2:
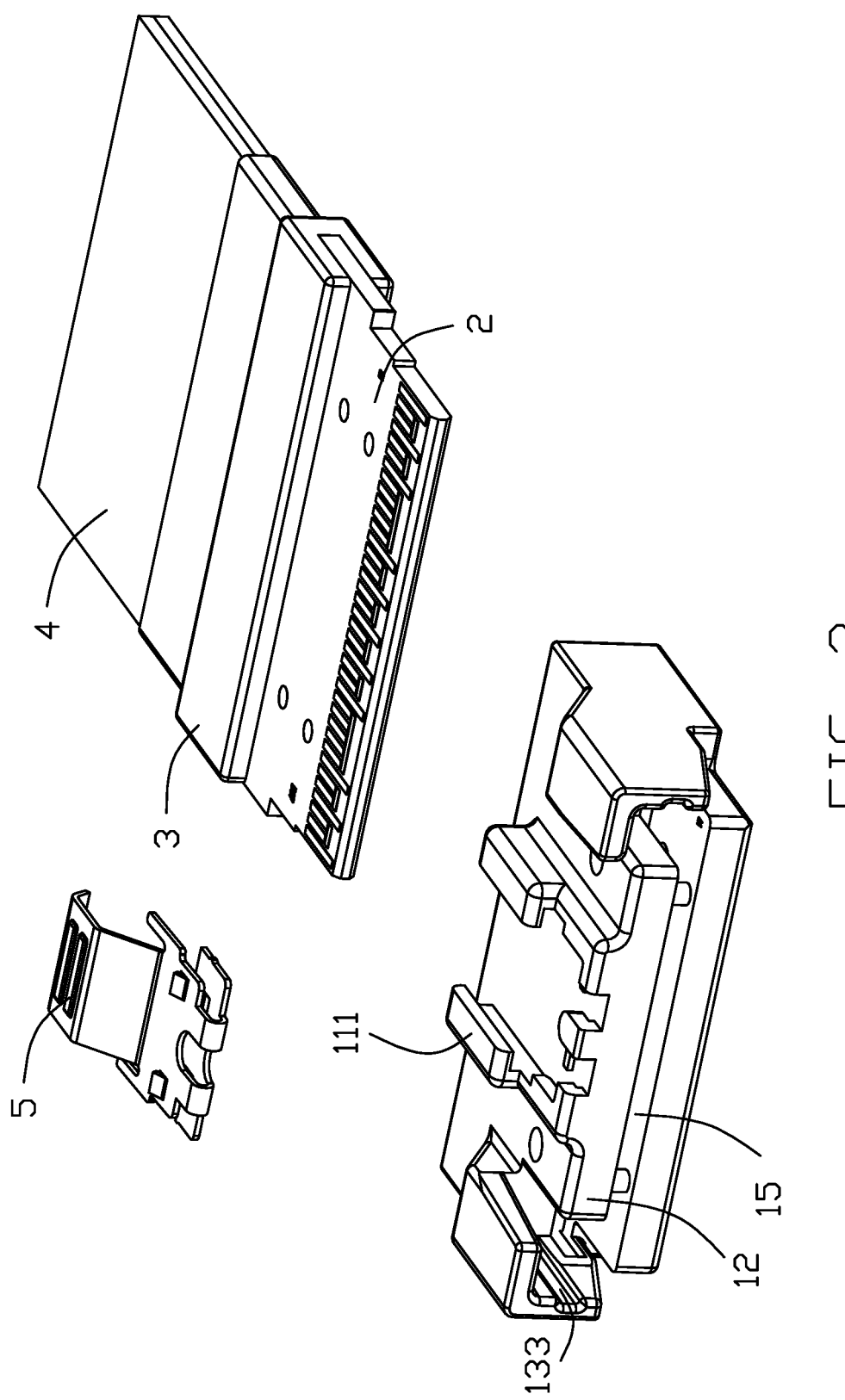
FIG. 2 is an exploded view of the plug connector as shown in FIG. 1.
Figure 3:
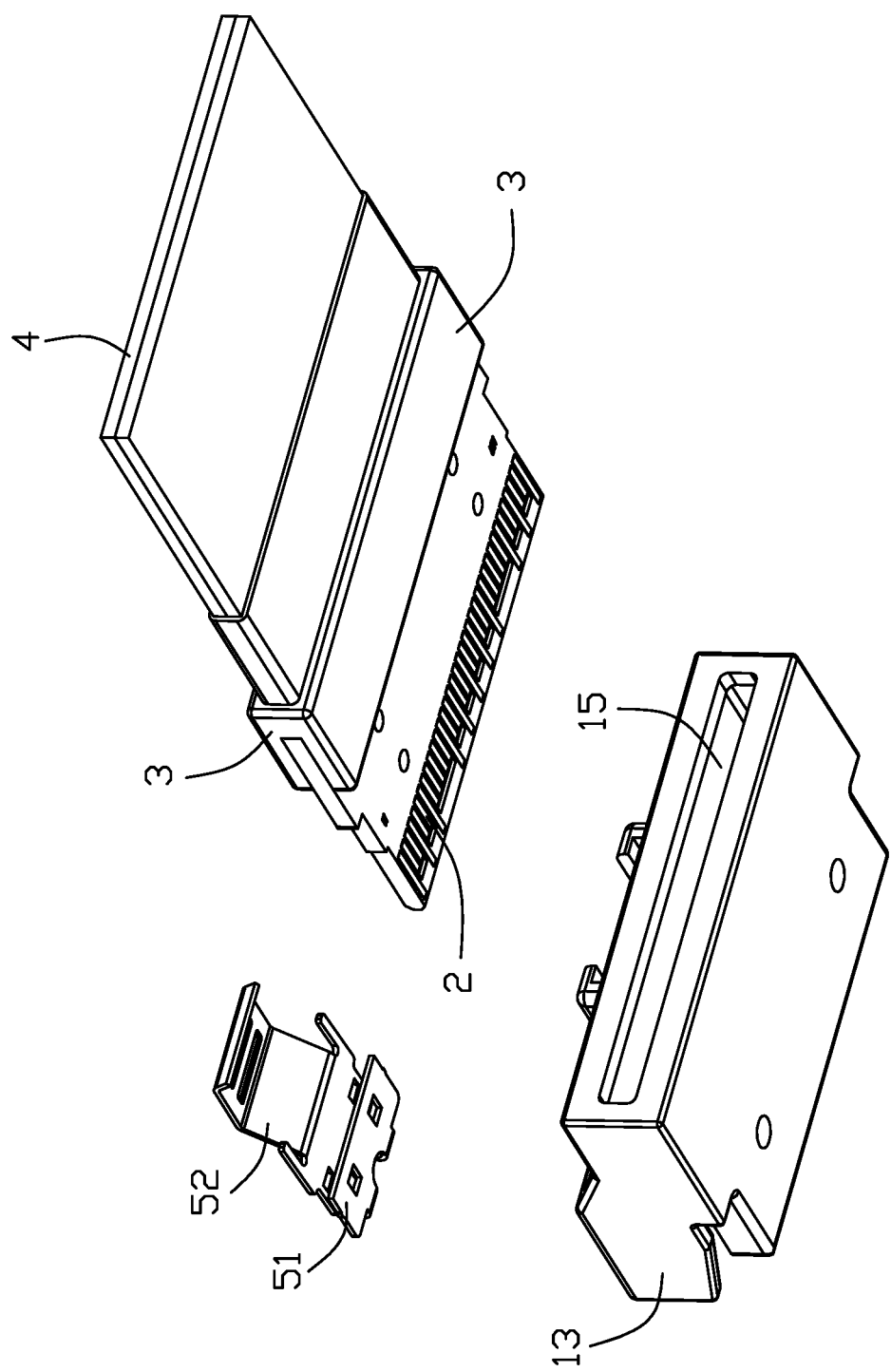
FIG. 3 is another exploded view of the plug connector as shown in FIG. 2.
Figure 4:
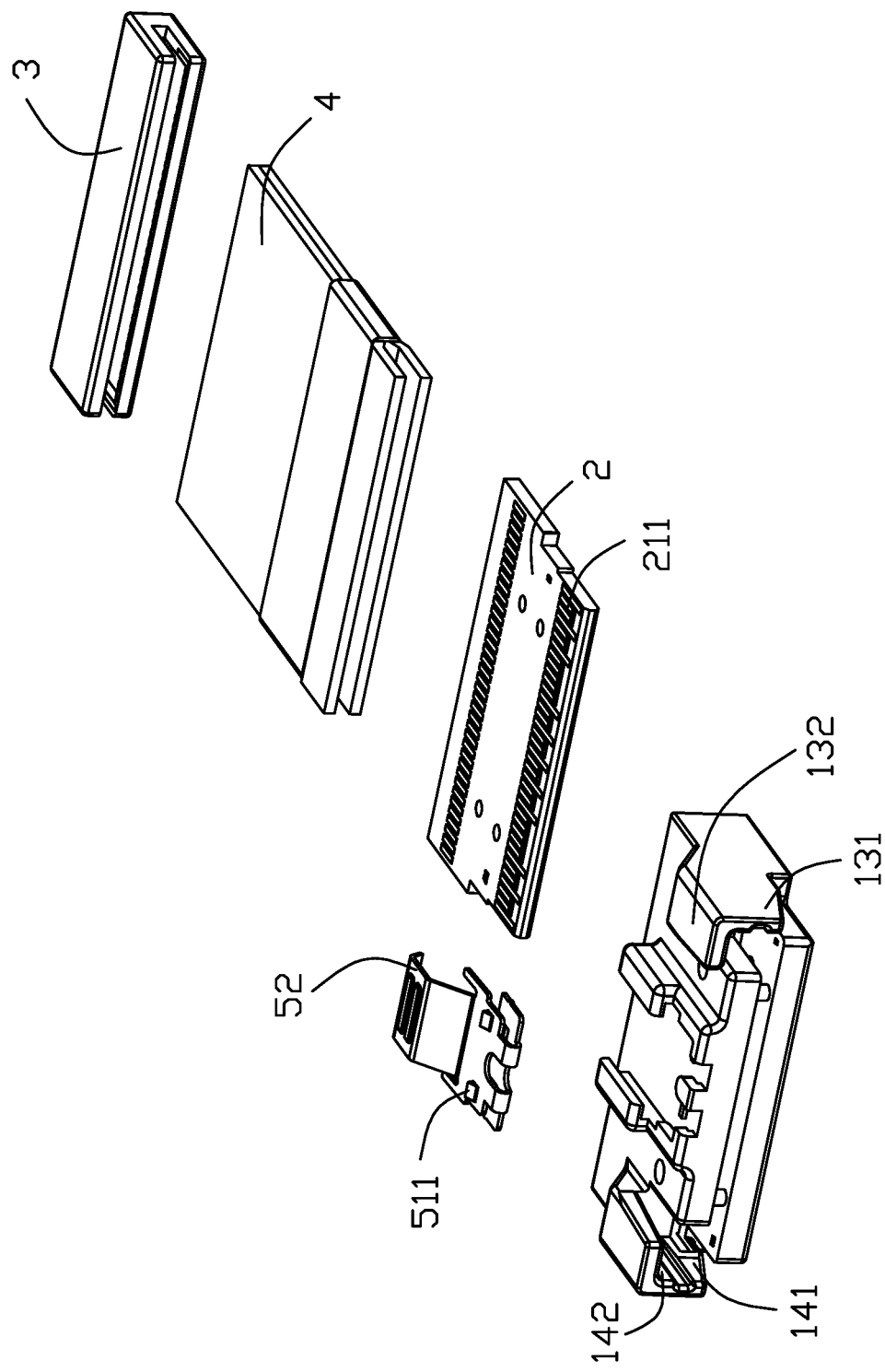
FIG. 4 is a further exploded view of the plug connector as shown in FIG. 2.
Figure 5:
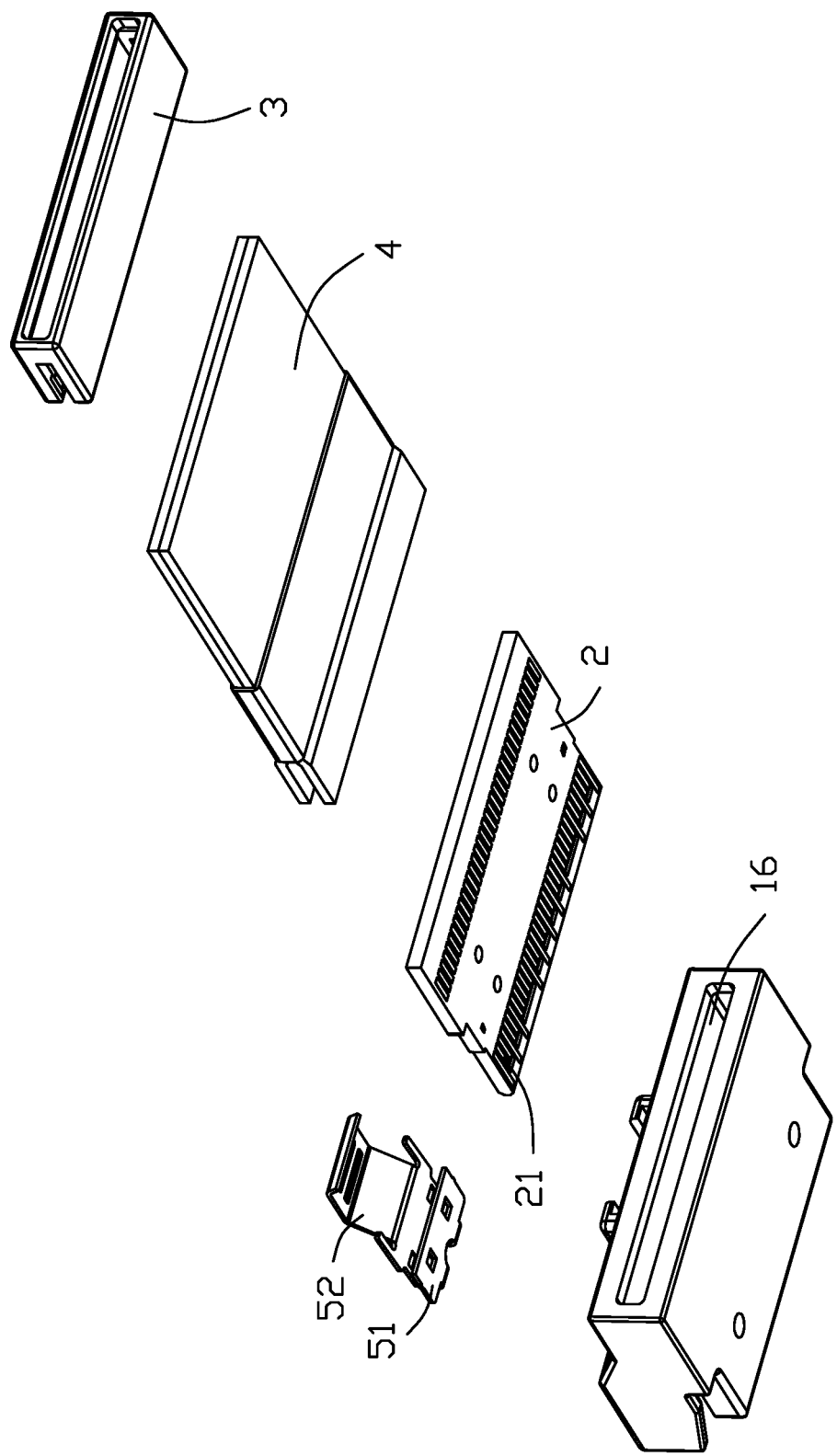
FIG. 5 is another further exploded view of the plug connector as shown in FIG. 4.
Figure 6:
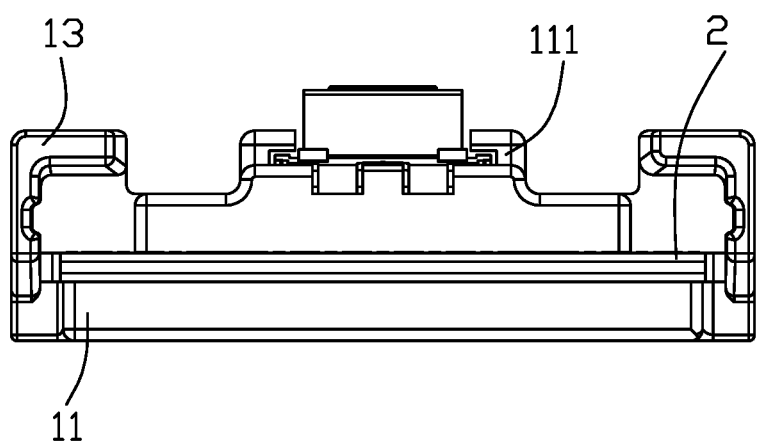
FIG. 6 is a front view of the cable connector as shown in FIG. 1.

Referring to FIGS. 1-6, a plug connector 100 used to mate with the socket connector includes an insulative housing 1, a printed circuit board 2 partially received in the insulative housing 1, an inner mold 3 received in the insulative housing 1, a cable 4 connected with the printed circuit board 2, and a locking spring member 5.

The insulative housing 1 includes a main body 11, a reinforcement 12 projecting forward from the main body 11, a pair of baffle plates 13 on the left and right sides of the main body 11, an opening 15 at the front end of the main body 11, and a hole 16 communicating with opening 15. The upper end of the reinforcement 12 is provided with a step 121 for fixing the locking spring member 5. The baffle plates 13 includes a side baffle plate 131, an upper baffle plate 132 horizontally connected with the side baffle plate 131, and a groove 133 inside the baffle plate 13 to guide the mating of the plug connector 100 and the socket connector. The upper baffle plate 132 extends horizontally from the upper end of the side baffle plate 131 toward the inner side and is located at a vertical distance from the reinforcement 12. The front ends of the side baffle plate 131 and the upper baffle plate 132 tend to be flush and extend forward beyond the reinforcement 12. A limiting groove 14 is formed between each baffle plate 13 and the printed circuit board 2. The limiting groove 14 includes a side limiting groove 141 and an upper limiting groove 142 communicated with the side limiting groove 141. The side limiting groove 141 is disposed between the printed circuit board 2 and the side baffle plate 131. The upper limiting groove 142 is disposed between the printed circuit board 2 and the upper baffle plate 132. The upper and lower and forward directions of the limiting groove 14 penetrate the insulative housing 1.

The printed circuit board 2 is placed horizontally, the insulative housing 1 is directly overmolded on the printed circuit board 2. The printed circuit board 2 has an insertion portion 21 protruding forward from the reinforcement 12, and a plurality of metal plates 211 are provided on the upper and lower surfaces of the insertion portion 21. The insertion portion 21 passes through the through hole 16 and extends forward from the opening 15. Wherein the reinforcement 12 is wrapped on the printed circuit board 2, and the width of the insertion portion 21 in the horizontal direction is larger than the width of the reinforcement 12. Through the above arrangement, the space of the limiting groove 14 between the baffle plate 13 and the printed circuit board 2 can be increased, so that when mating with the socket connector, a small range of oblique insertion of the plug connector can be achieved without accurate mating. In this embodiment, the main body includes a forwardly extending bottom plate, as indicated by reference numeral 11 in FIG. 6, in opposite to the reinforcement 12 in the vertical direction so as to cooperate with the reinforcement 12 to commonly tightly sandwich the printed circuit board 2 therebetween in the vertical direction. A pair of posts (not labeled while shown in FIGS. 2 and 4) unitarily extend between the reinforcement 12 and the bottom plate to extend through the corresponding holes (not labeled while shown in FIGS. 2-5) in the printed circuit board 2 for retaining the printed circuit board 2 to the insulative housing 1.

The inner mold 3 is U-shaped and is wrapped at the junction of the printed circuit board 2 and the cable 4 to hold the connection between the printed circuit board 2 and the cable 4.

The front end of the cable 4 is connected with the printed circuit board 2, and the rear end extends out of the insulative housing 1.

The locking spring member 5 includes an elastic piece 51 fixed to the step 121 and a pressing piece 52 provided at the rear end of the elastic piece 51. The upper surface of the elastic piece 51 is provided with a locking protrusion 511 for cooperating with the locking hole of the socket connector. The elastic piece 51 can drive the locking protrusion 511 to swing elastically up and down. When the user manually presses the pressing piece 52, the elastic piece 51 can be caused to swing downward to unlock the socket connector.

When the plug connector 100 is mated with the socket connector, the side wall of the socket connector enters the side limiting groove 141 and is restricted from moving left and right, while the top wall of the socket connector enters the upper limiting groove 142 and is restricted from moving up and down, so as to guide the plug connector 100 to be inserted horizontally, to avoid the insertion portion 21 of the printed circuit board 2 from straddling the conductive terminal of the socket connector, and to reduce the risk of pin collapse.

What is claimed is:

1. A plug connector comprising:
an insulative housing including a main body, a reinforcement projecting forward from the main body, and a pair of baffle plates; and
a printed circuit board partially received in the insulative housing, the printed circuit board extending forward from the main body and beyond the reinforcement, the reinforcement and the main body sandwiching the printed circuit board, wherein
a width of a front end of the printed circuit board exposed outside the main body in a horizontal direction is greater than a width of the reinforcement, and a limiting groove is formed between each baffle plate and the printed circuit board for guiding the plug connector to mate with a socket connector.

2. The plug connector as claimed in claim 1, wherein the reinforcement is located on the upper and lower surfaces of the insulative housing.

3. The plug connector as claimed in claim 1, wherein the baffle plates include a pair, and the pair of baffle plates are respectively located on both sides of the main body.

4. The plug connector as claimed in claim 3, wherein each baffle plate includes a side baffle plate perpendicular to the printed circuit board, the limiting groove includes a side limiting groove between the printed circuit board and the side baffle plate.

5. The plug connector as claimed in claim 4, wherein each baffle plate includes an upper baffle plate connected with the side baffle plate, the limiting groove includes an upper limiting groove between the printed circuit board and the upper baffle plate.

6. The plug connector as claimed in claim 5, wherein the upper baffle plate extends horizontally inward from the upper end of the side baffle plate and is located at the upper end of the printed circuit board.

7. The plug connector as claimed in claim 3, wherein a groove is provided on the inner side of the baffle plate to guide the plug connector to mate with the socket connector.

8. The plug connector as claimed in claim 1, wherein the plug connector includes an inner mold received in the insulative housing.

9. The plug connector as claimed in claim 8, wherein the plug connector includes a cable electrically connected to the printed circuit board, the inner mold is wrapped at the junction of the printed circuit board and the cable to hold the connection between the printed circuit board and the cable.

10. The plug connector as claimed in claim 1, wherein the plug connector includes a spring piece on the reinforcement to mate with the socket connector.

11. A plug connector comprising:
an insulative housing including a main body defining a hole extending therethrough in a front-to-back direction, and a plate like reinforcement projecting forwardly from the main body and spaced from a bottom plate of the main body in a vertical direction perpendicular to the front-to-back direction;
a printed circuit board being retained within the insulative housing and extending through the hole and tightly sandwiched between the reinforcement and the bottom plate in the vertical direction; and
a pair of L-shaped baffle plates forms on opposite sides of the main body and spaced from all of the reinforcement, the printed circuit board and the bottom plate in the vertical direction and a transverse direction perpendicular to both the front-to-back direction and the vertical direction; wherein
the printed circuit board is wider than the bottom plate in the transverse direction and the bottom plate is wider than the reinforcement in the transverse direction.

12. The plug connector as claimed in claim 11, wherein each of said L-shaped baffle plates includes an upper baffle plate located at a level higher than the reinforcement in the vertical direction, and a side plate located on an outer side of all of the reinforcement, the printed circuit board and the bottom plate.

13. The plug connector as claimed in claim 11, wherein the insulative housing is overmolded on the printed circuit board.

14. The plug connector as claimed in claim 13, wherein the printed circuit board extends forwardly beyond both the bottom plate and the reinforcement in the front-to-back direction, and a front end region of the printed circuit board forms a plurality of circuit pads exposed to an exterior in the vertical direction.

* * * * *